US010396301B2

(12) United States Patent
Farouk Mohamed (10) Patent No.: US 10,396,301 B2
(45) Date of Patent: Aug. 27, 2019

(54) ORGANIC SOLAR CELL WITH VERTICAL ACTIVE LAYERS

(71) Applicant: Ahmed Magdy Farouk Mohamed, Brookline, MA (US)

(72) Inventor: Ahmed Magdy Farouk Mohamed, Brookline, MA (US)

( * ) Notice: Subject to any disclaimer, the term of this patent is extended or adjusted under 35 U.S.C. 154(b) by 442 days.

(21) Appl. No.: 14/399,295

(22) PCT Filed: May 8, 2013

(86) PCT No.: PCT/US2013/040159
§ 371 (c)(1),
(2) Date: Nov. 6, 2014

(87) PCT Pub. No.: WO2013/169911
PCT Pub. Date: Nov. 14, 2013

(65) Prior Publication Data
US 2015/0107663 A1  Apr. 23, 2015

Related U.S. Application Data

(60) Provisional application No. 61/644,327, filed on May 8, 2012.

(51) Int. Cl.
*H01L 51/44* (2006.01)
*H01L 51/42* (2006.01)

(52) U.S. Cl.
CPC ........ *H01L 51/441* (2013.01); *H01L 51/4206* (2013.01); *H01L 51/44* (2013.01); *Y02E 10/549* (2013.01)

(58) Field of Classification Search
CPC .... H01L 51/4206; H01L 51/441; H01L 51/44
See application file for complete search history.

(56) References Cited

U.S. PATENT DOCUMENTS

| 6,407,330 B1* | 6/2002 | Lindsey | ................. B82Y 30/00 136/252 |
| 7,655,860 B2* | 2/2010 | Parsons | ................. B82Y 10/00 136/243 |
| 2003/0140959 A1* | 7/2003 | Gaudiana | ............. H01G 9/2031 136/244 |

(Continued)

FOREIGN PATENT DOCUMENTS

| JP | 2005011841 | 1/2005 | ............. H01L 31/04 |
| SU | 1825246 | 4/1995 | ............. H01L 31/04 |

OTHER PUBLICATIONS

ISA/Russian Commissioner of Patents, International Search Report and Written Opinion for PCT/US2013/040159, dated Sep. 5, 2013, 6 pages.

(Continued)

*Primary Examiner* — Golam Mowla
(74) *Attorney, Agent, or Firm* — Sunstein Kann Murphy & Timbers LLP (57) ABSTRACT

A photovoltaic device includes a substrate, an active layer with at least one organic material, and a pair of electrodes supported by the substrate. The active layer includes a first surface that receives light and a second surface that is supported by the substrate. The second surface is opposite to the first surface. Surfaces of the electrodes that contact surfaces of the active layer are perpendicular to the substrate.

21 Claims, 7 Drawing Sheets

(56) References Cited

U.S. PATENT DOCUMENTS

| | | |
|---|---|---|
| 2005/0051205 A1 | 3/2005 | Mook, Jr. |
| 2006/0185713 A1 | 8/2006 | Mook, Jr. |
| 2007/0034250 A1 | 2/2007 | Dutta |
| 2007/0113881 A1* | 5/2007 | Mellott .................. C03C 3/087 136/243 |
| 2008/0178924 A1 | 7/2008 | Kempa et al. ................ 136/244 |
| 2012/0049242 A1 | 3/2012 | Atanackovic et al. |
| 2012/0090677 A1 | 4/2012 | Sater |
| 2012/0152322 A1 | 6/2012 | Kribus et al. |

OTHER PUBLICATIONS

Kamins, Ted Consulting Professor, Semiconductor Nanowires for Solar Cells: Single Junction and Heterojunction Photovoltaics, 29 pages, Oct. 20, 2010 www.isetc.org/English/Archives/201010/.../ISETC-2010-Oct20-Ted_Kamins.pdf.

Technologies, New Horizon, Simple Design and Manufacturing Process for High-Intensity Silicon Vertical Multi-Junction Solar Cells: *Inventions & Innovation,* Project Fact Sheet, 2 pages haps://www.nrel.gov/docs/fy01osti/28264.pdf, Jan. 17, 2001.

* cited by examiner

ORGANIC SOLAR CELL WITH VERTICAL ACTIVE LAYERS

PRIORITY

This patent application claims priority from U.S. Provisional Application No. 61/644,327, filed May 8, 2012, entitled "Enhanced Architecture for Photovoltaics," and naming Ahmed Magdy Farouk Mohamed as an inventor, the disclosure of which is incorporated herein, in its entirety, by reference.

FIELD OF THE INVENTION

The invention generally relates to photosensitive devices and, more particularly, the invention relates to organic photovoltaics.

BACKGROUND OF THE INVENTION

Photovoltaics or solar cells make use of the photoelectric effect. A photovoltaic device has an active layer that absorbs incident light. The photons excite electrons in the active layer to a higher energy band. In the presence of an electric field, these electrons drift towards the electrodes. These electrodes are connected to an exterior circuit that acts as a load to the photovoltaic. The electrons pass through the exterior circuit, creating a current. The electrodes and the active layer are mounted on top of a substrate. Conventional photovoltaics have a transparent substrate through which the light passes. A transparent first electrode (e.g., an anode), is on top of the substrate. An active layer overlaps this electrode. The active layer can be a single layer or a stack of several layers, with or without isolations between them. A second electrode (e.g., a cathode) resides on top of the active layer, and the second electrode can be made of one or more types of metal.

SUMMARY OF VARIOUS EMBODIMENTS

In accordance with one embodiment of the invention, an organic photovoltaic device includes a substrate, an active layer with at least one organic material, and a pair of electrodes supported by the substrate. The active layer includes a first surface that receives light and a second surface that is supported by the substrate. The second surface is opposite to the first surface. Surfaces of the electrodes that contact surfaces of the active layer are perpendicular to the substrate.

In some embodiments, the active layer includes a soluble material. The active layer may include quantum dots or nano-particles. The active layer may include at least two stacked layers of active materials. Further, the active layer may include isolation layers disposed between each layer of active material.

In various embodiments, each electrode includes a non-transparent material. Each electrode may include an ink of nano-particle metal, and the metal may be copper or silver. Each electrode may cover a portion of a lateral area of the active layer. In some embodiments, one of the electrodes circumscribes the active layer and the active layer circumscribes the other of the electrodes.

In many embodiments, the device includes a focusing layer. The focusing layer may be disposed over the first surface of the active layer and the pair of electrodes, and the focusing layer may direct incident light to the active layer or distribute light spectrum over adjacent active layers. The focusing layer may have a variable refractive index. In some embodiments, the focusing layer includes organo titanates. In some embodiments, the focusing layer includes an organic polymer and titanium dioxide. Concentrations of titanium dioxide may vary within the focusing layer to produce varying refractive indices. In some embodiments, the focusing layer includes a regular lens or a Fresnel lens.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In conventional photovoltaic structures, such as those discussed above, the light has to pass through the substrate and the transparent electrode before impinging on the active layer. The substrate and transparent electrode thus reduce the amount of light that reaches the active layer. Sometimes, one or more layers are added on top of the electrode before the active layer for better energy matching. These added layers further decrease the amount of light that will reach the active layer.

In addition, the first electrode (e.g., anode) should have a high transmittance, which prevents the use of highly conductive materials that can provide better ohmic contact with the active layer. This requirement undesirably reduces the amount of charge that can be extracted from the active layer. Moreover, the active layer should be as thin as possible to decrease the distance traveled by the electrons to increase the extraction efficiency of charges. This reduces the distance traveled by the light inside the active layer, which reduces the amount of photons that can be absorbed and thus, reduces the amount of charges that can be created.

Various embodiments of the invention should remedy many of these and other problems. The apparatuses are related generally to photovoltaic devices, such as organic photovoltaics (OPV) or organic solar cells. The apparatuses also relate to any photovoltaic device made with an active material that can be dissolved and used as ink.

The organic photovoltaic devices of the various embodiments have active layers fabricated from soluble materials. The devices have components with different orientations, thereby allowing the light to enter the active layer without passing through multiple layers first. As a result, an increased amount of light reaches the active layer, compared to conventional devices. Without wishing to be bound by theory, the elimination of the need for a transparent electrode allows oblique materials to be used, for better charge extraction. In various embodiments, the depth of the active layer (e.g., the distance traveled by light in the active layer) is not related to the thickness of the layer, which preferably is very thin for better charge extraction. Therefore, the active layer can be as thin as possible and as deep as desired, thereby increasing the light absorption without compromising the charge extraction efficiency.

In addition to enhancing the efficiency of the light inserting and charge extraction, the organic photovoltaic devices of various embodiments may be manufactured using inexpensive techniques, such as ink-jet printing or extrusion printing. The devices can be made from a wide range of materials and can assume several configurations, as described below. Several layers can be added in the same device to increase the device's efficiency, as described below. Further, some embodiments of the device include a focusing layer with a variable refractive index. The focusing layer concentrates light incident on the device to the active layer(s). In some embodiments, the active layer may have quantum dots and/or nano-particles for enhanced absorption. In further embodiments, the active layer may have multiple stacked active materials (or layers), thereby increasing spectral absorption.

Figure 1:
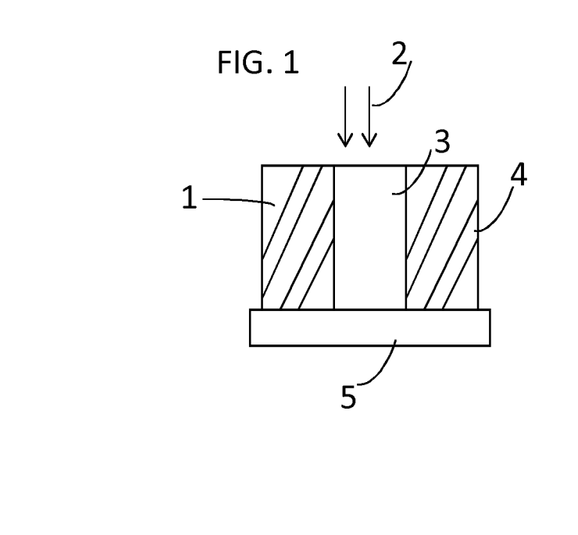
FIG. 1 depicts a cross section view of an exemplary organic photovoltaic device.

FIG. 1 depicts an exemplary organic photovoltaic device. The device includes a substrate 5, two electrodes 1, 4 (e.g., one anode and one cathode; the electrodes may be made of the same materials or different materials), and an active layer 3 between the electrodes 1, 4. The arrows 2 show the direction of light and the side where the light enters the photovoltaic device. In some embodiments, the active layer 3 includes two active materials, such as a donor and an acceptor. These two active materials may be disposed adjacent to one another or blended. The term active layer will be used hereafter without specifying the composition of this layer.

In the exemplary device of FIG. 1, the light enters the active layer 3 without attenuation by any other layer. This increases the light insertion, compared to a conventional photovoltaic device, in which the active layer is horizontally oriented and partially obscured by an electrode, among other components. The thickness of the active layer (e.g., the distance between the inner edges of 1 and 4) does not affect the depth of the cell (the height of the active layer 3 from the substrate 5). Without wishing to be bound by theory, this means that the device can be as deep as needed to ensure high absorption of the incoming light to increase the charge creation in the active layer 3. In contrast, in the conventional device, the depth cannot be increased over a limit since the extraction of charges would drop drastically. Further, in the device of this applicant, the active layer 3 may be very thin in order to extract as much charges as possible. In some embodiments, the width of the active layer 3 may be between about 150 nm and about 1000 nm. In some embodiments, the width is about 800 nm. The device is advantageous over the conventional devices, in which charge extraction and light absorption are negatively correlated.

Furthermore, various embodiments of the device may use two oblique, highly conductive electrodes. Transparent electrodes that must be used in conventional devices have a high resistivity that reduces the output current of the device. Further, transparent electrodes do not provide a good ohmic contact with the active layer. As a result, the potential barrier between the active layer and the electrode(s) reduces the open circuit voltage of the device. These two deficiencies in the transparent electrodes induce a loss of potential and charge, thereby reducing the efficiency of the cell. Such deficiencies are substantially eliminated in the organic photovoltaic devices implementing various embodiments of the invention.

Additionally, illustrative embodiments of the organic photovoltaic device may be easily and inexpensively manufactured. For example, the active layer may be deposited using an ink-jet printer. In conventional devices, the top electrode (e.g., cathode) often is not be easily deposited on top of the active layer using an ink jet printer, using a nano-particle ink of metals like copper and silver. In particular, after the deposition of the nano-particle metal ink for the electrode(s), a calcination process with relatively high temperature is required. The high temperature can damage the material in the active layer. In various embodiments, the electrodes may be deposited before the depositing of the active material, allowing ink jet printing of both electrodes. Moreover, the substrate may be any arbitrary highly resistive surface. Since the substrate does not play a role in the operation and efficiency of the device, the substrate does not require complicated and expensive treatments. In contrast, in the conventional devices in which the active layers and electrode(s) are horizontally oriented, the substrate and the electrode (e.g., anode) disposed on top of the substrate play critical roles. For these reasons, among others, the devices of the present application are expected to be easier and less expensive to manufacture.

Figure 2:
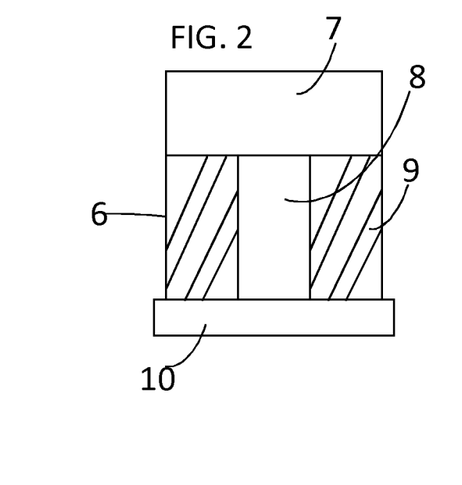
FIG. 2 depicts an exemplary organic photovoltaic device with a focusing layer.

Illustrative embodiments have limited area(s) of exposure—the effective areas are small. The area of the active layer exposed to the light is less than the total area of the device. Thus, in some embodiments, the device includes a focusing layer that concentrates all the incident light on the device in the active layer 3, thereby increasing the effective area. In FIG. 2, an exemplary organic photovoltaic device with a focusing layer 7 is depicted. The rest of the device in FIG. 2 is comparable to the device in FIG. 1. For example, the components 6, 8, 9, and 10 are comparable to the components 1, 3, 4 and 5 in FIG. 1 respectively.

In some embodiments, the focusing layer 7 is a regular lens, Fresnel lens, or any other focusing structure. In some embodiments, the focusing layer 7 may be made of a graded refractive index slab, which depends on the material used rather than the structure. A graded refractive index slab may have a refractive index profile dictated by the width of the device (e.g., the distance between the outer edges of the electrodes 6 and 9), the height of the focusing layer 7 (e.g., perpendicular distance from the top edge of the active layer 8 to the top of the focusing layer 7), and the material used to make the graded refractive index slab. In many embodiments, the focusing layer 7 is made of a highly transparent material to transmit most of the light to the active layer 8. The focusing layer 7 preferably is highly resistive, thereby minimizing the leak current between the electrodes. In many embodiments, the focusing layer 7 is a good insulator that protects the material(s) in the active layer 7 from oxidation and corrosion, thereby increasing the material's lifetime. In some embodiments, the focusing layer 7 includes organo titanates, or an organic polymer and titanium dioxide. Varying concentrations of the titanium dioxide or the organo titanates may changes the refractive index at positions along the focusing layer 7. The focusing layer 7 may have high transmittance in the size order of the photovoltaic devices.

Figure 3:
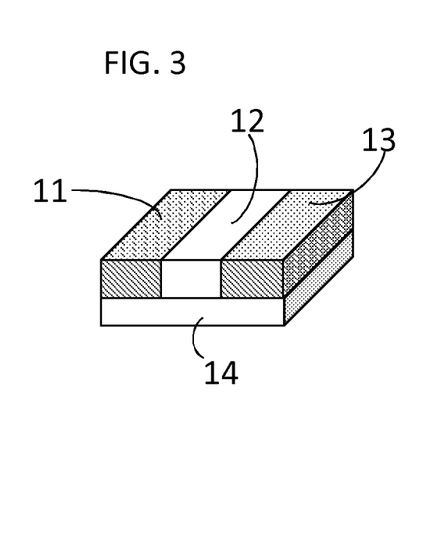
FIG. 3 depicts a three dimensional view of the exemplary organic photovoltaic device of FIG. 1.
Figure 4:
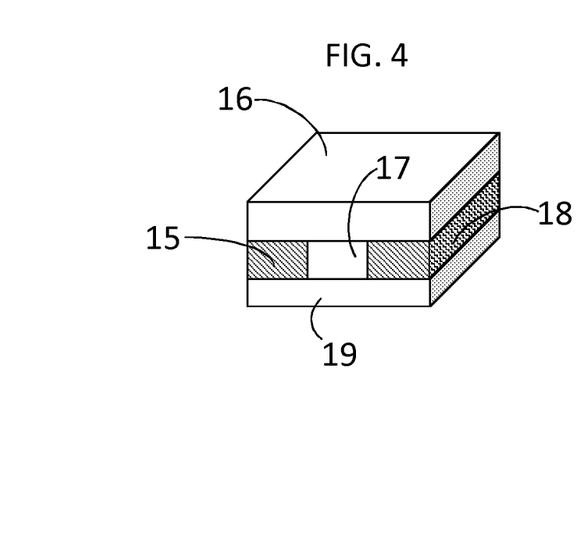
FIG. 4 depicts a three dimensional view of the exemplary organic photovoltaic device of FIG. 2.

FIG. 3 and FIG. 4 depict three dimensional views of the devices in FIG. 1 and FIG. 2, respectively. Components 11, 12, 13 and 14 correspond to components 1, 3, 4 and 5, respectively, and components 15, 16, 17, 18 and 19 correspond to components 6, 7, 8, 9, and 10, respectively. In many embodiments, the depth in the third dimension depends on the ability to maintain uniformity of the materials for a long distance. Thus, the maximum depth possible for an active layer may be dependent on the fabrication process used for the device.

Figure 5:
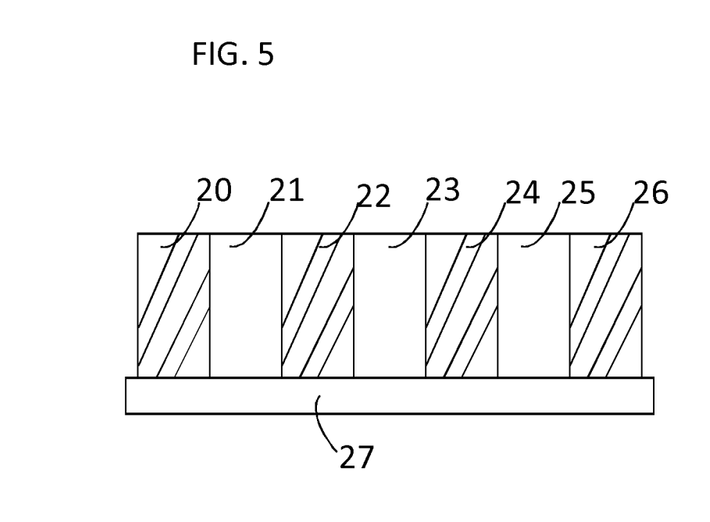
FIG. 5 depicts an exemplary panel of organic photovoltaic devices.
Figure 6:
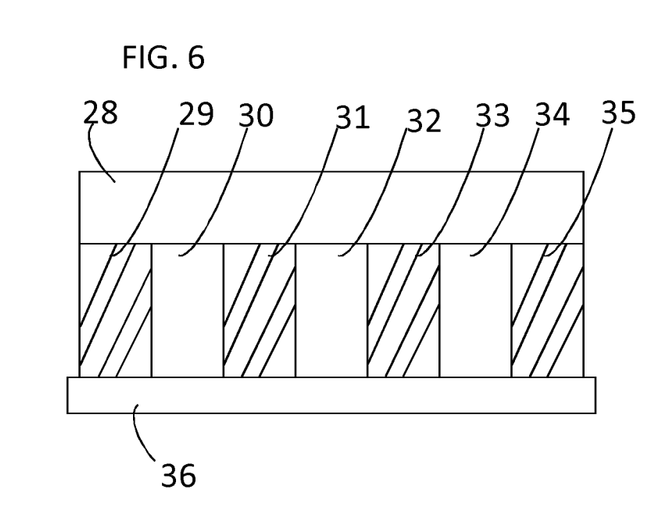
FIG. 6 depicts an exemplary panel of organic photovoltaic devices with a focusing layer.

FIG. 5 and FIG. 6 depict exemplary panels of organic photovoltaic devices (e.g., panels of solar cells). FIG. 5 depicts a panel of the devices of FIG. 1 and FIG. 6 depicts a panel of the device in FIG. 2. Components 20, 22, 24 and 26 in FIG. 5 and components 29, 31, 33 and 35 in FIG. 6 are the electrodes, while components 21, 23 and 25 in FIG. 5 and components 30, 32 and 34 in FIG. 6 are the active layers. Further, component 27 in FIG. 5 and component 36 in FIG. 6 are the substrates. In the device depicted in FIG. 6, the focusing layer 28 is a concatenation of several focusing layers (e.g., each layer concentrates the light in its respective active layer underneath it). In some embodiments, the focusing layer 28 is disposed solely on the active layers. In some embodiments, the focusing layer 28 focuses light in different areas within the active layer. For example, the focusing layer 28 may focus light from different wavelengths in different areas within the active layer. In another example, the focusing layer 28 may focus light from different wavelengths on different active layers 30, 32, 34. These structures for large panels allows the voltages of the devices to be added while keeping the output current, which is not possible with conventional devices.

Figure 7:
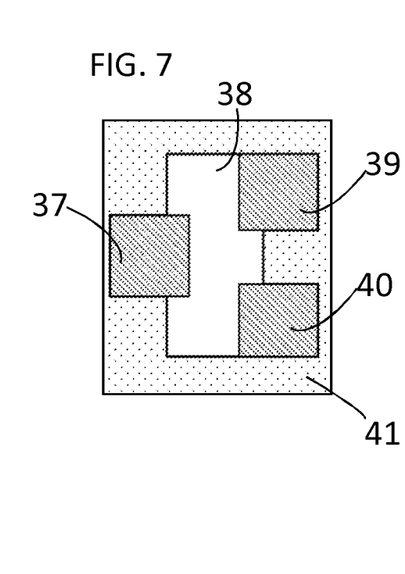
FIG. 7 depicts a top view of an exemplary configuration for an organic photovoltaic device, in which the electrodes are not in parallel and the active layer is between them.

Various embodiments may include additional features that improve their operation. For example, an isolation layer between an active layer and an electrode may reduce the current leakage of a device. In some embodiments, the device may include a hole transport buffer next to the anode and/or an electron transport buffer next to the cathode. In some embodiments, the electrodes may be placed in an alternating manner, instead of placed in a parallel manner as shown in FIG. 7. In some embodiments, the electrodes 37 (e.g., cathode) and 39 and 40 (e.g., anode) can be positioned so that they do not cover the entire lateral area of the active layer 38. Each electrode may cover a portion of the lateral area. This embodiment depicted in FIG. 7 (e.g. a top view of the device, with component 41 representing the substrate) may reduce the capacitance effect that causes the accumulation of charges in the interface between the active layer and the electrodes.

Figure 8:
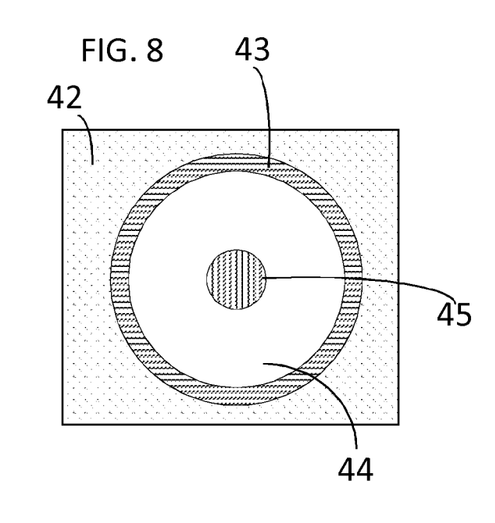
FIG. 8 depicts a top view for another exemplary configuration for an organic photovoltaic device, in which the electrodes are concentric cylinders.

The electrodes may have regular or irregular shapes, such as the configuration depicted in FIG. 8. For example, the electrodes may be curvier. In further examples, the electrodes may be in the forms of cylindrical rods or semicircles. In some embodiments, an electrode may be hollow, while in other embodiments, an electrode may be solid. In various embodiments, an electrode may circumscribe an active layer, and the active layer may circumscribe another electrode. In some embodiments fabricated via inkjet printing, the configurations of the electrodes and active layer may be built by depositing layers upon layers of materials to form any arbitrary three dimensional shape that can optimize the extraction of electrons. In FIG. 8, component 42 is an isolation layer sitting on top of a substrate and a metal layer, components 43 and 45 are the electrodes, and component 44 is the active layer. This and various other embodiments of the devices may minimize the capacitance effect caused by having two electrode plates in parallel.

Figure 9:
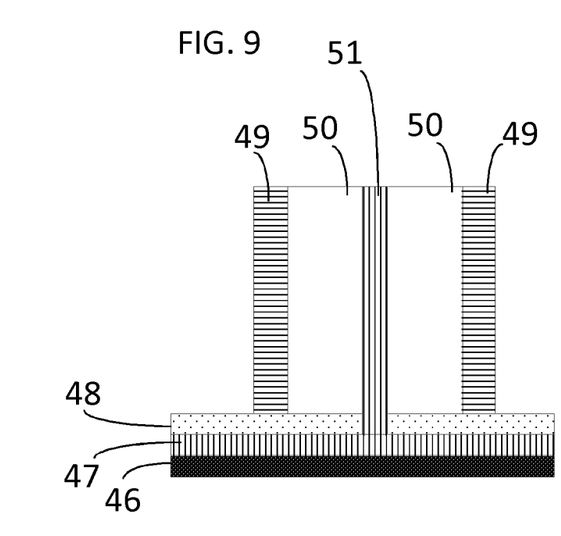
FIG. 9 depicts a lateral cross-sectional of the exemplary configuration described in FIG. 8.

FIG. 9 shows the lateral cross section of the exemplary device depicted in FIG. 8. In this embodiment, component 46 is the substrate, component 47 is a conductor layer, component 48 is an isolation layer, component 49 is the outer electrode, component 50 is the active layer, and component 51 is the inner electrode extending through the other layers to the conduction layer 47. The dimensions of each of these layers may be selected to maximize charge extraction and minimize current leakages. In some embodiments, the dimensions may be around 1.0 μm. In this embodiment, the inner electrode 51 may be as high as the isolation layer connecting the conduction layer with the active layer.

Figure 10:
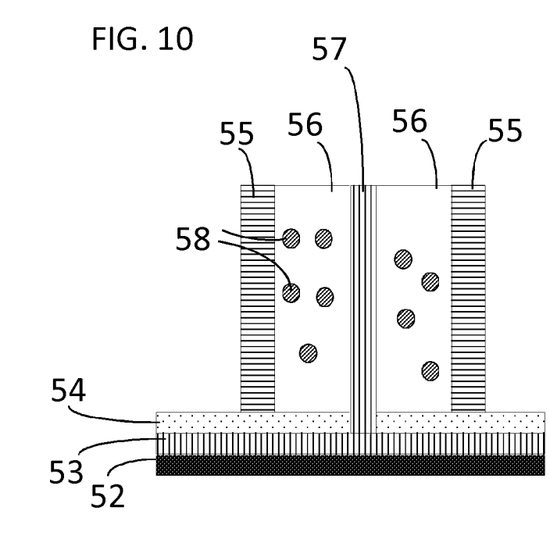
FIG. 10 depicts an exemplary cylindrical configuration for an organic photovoltaic device with absorption enhancers in the active layer.

FIG. 10 depicts an exemplary organic photovoltaic device with components in the active layer that may enhance the active's layers absorption. In some embodiments, inkjet or extrusion printing deposits various materials, layer by layer, to create an active layer with enhanced absorption. Components 53, 54, 55, 56 and 57 of FIG. 10 are comparable to the components 46, 47, 48, 49 and 50 of FIG. 9, respectively. In some embodiments, component 58 includes quantum dots. In other embodiments, component 58 includes nano-particles. In various embodiments, quantum dots may be deposited between layers of the active material. The quantum dots may absorb high energy photons and re-emit the energy in the form of several small energy photons, thereby reducing the spectral loss in the photovoltaic device. Nano-particles (e.g., in the form of spheres or rods) may be deposited between materials for an active layer. Without wishing to be bound by theory, these nan-particles may act as optical antennas and change the local green function of the active layer, thereby greatly enhancing light absorption.

Figure 11:
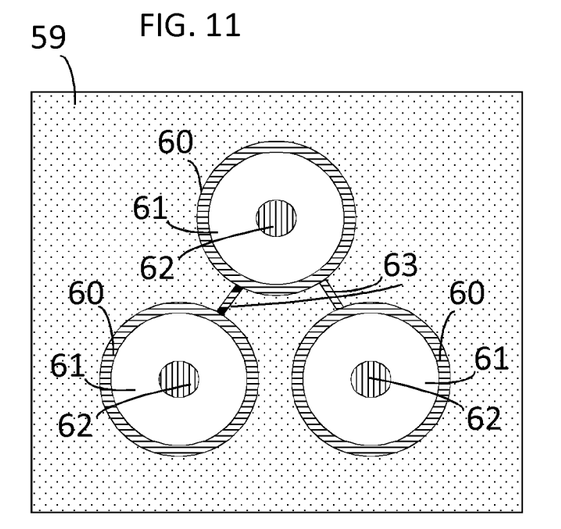
FIG. 11 depicts an exemplary panel of connected organic photovoltaic devices with cylindrical configurations.
Figure 12:
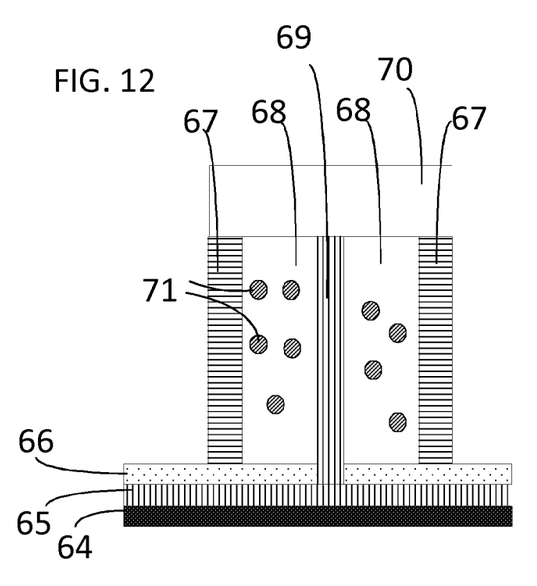
FIG. 12 depicts an organic photovoltaic device with a cylindrical configuration and a focusing layer used to direct light to the active layer.

FIG. 11 depicts a configuration of photovoltaic devices, in which the devices are connected to form a panel. Components 59, 60, 61 and 62 of FIG. 11 correspond to components 42, 43, 44 and 45 of FIG. 8, respectively. In this embodiment, components 63 are metal links between the devices to connect their outer electrodes to propagate the electricity out. FIG. 12 depicts the embodiment in FIG. 10 in addition to focusing layer 70, which is comparable to the focusing layer 7 in FIG. 2. This focusing layer may be adapted for any configuration underneath it. The points of concentration of light under the layer depend on the refractive index profile of the transparent layer. In many embodiments, changing the positions of high refractive index areas and low refractive index areas changes the position in which light and the different parts of spectral components of the light will be concentrated.

The refractive index of some materials can be changed by changing the concentration of metal oxides in them. In some embodiments, a complex focusing layer may be fabricated by depositing a homogenous layer of a basic transparent material on top of the entire panel of devices. Then, oxides or any materials that would change the local refractive index may be selectively deposited in areas on the focusing layer in order to change the refractive index profile of the layer that, in turn, focuses the light where the light may be most effectively absorbed (e.g., the active layers).

Figure 13:
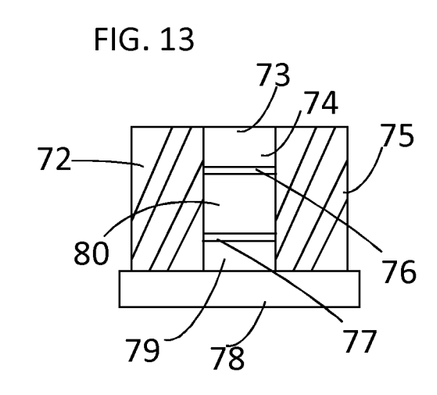
FIG. 13 depicts an exemplary organic photovoltaic device with more than one active material in the active layer.

Various other features may increase the amount of light absorbed by the device. For example, using several active materials with complementary absorption profiles for the active layer may increase the amount of light absorbed. FIG. 13 depicts an example of using the device of this application for this purpose. Components 72, 75 and 78 of FIG. 13 correspond to components 1, 4 and 5 in FIG. 1. In this embodiment, components 73, 80 and 79 are three types of active materials stacked on top of each other. Components 76 and 77 are thin transparent isolation layers that can be used, depending on the active materials used. In this embodiment, the top active material (or blend of materials) absorbs light, and remaining light may be transmitted through the isolation layer to the following active material, and so forth. Although FIG. 13 depicts three layers within the active layer, this depiction is exemplary, and any number of layers of active materials may be used.

The photovoltaic devices described in this application have an advantageous architecture for photovoltaics, including photovoltaics with ink-based active layers and/or organic photovoltaics. The devices may have one of several configurations, be made of various materials, and be manufactured following several fabrication processes.

Although the above discussion discloses various exemplary embodiments of the invention, it should be apparent that those skilled in the art can make various modifications that will achieve some of the advantages of the invention without departing from the true scope of the invention.

What is claimed is:

1. An organic photovoltaic device comprising:
   a substrate;
   at least first and second active layers, each active layer (1) having at least one organic material and (2) including a first surface that receives light and a second surface that directly contacts the substrate, the second surface being opposite to the first surface; and
   at least first, second, and third electrodes supported by the substrate, wherein (1) the first and second electrodes each have a surface, being substantially perpendicular to the substrate, that contacts the first active layer, (2) the second and third electrodes each have a surface, being substantially perpendicular to the substrate, that contacts the second active layer, (3) the first and third electrodes have a same polarity, and (4) the second electrode has an opposite polarity to the first and third electrodes.

2. The organic photovoltaic device of claim 1, wherein the first and second active layers each comprise a soluble material.

3. The organic photovoltaic device of claim 1, wherein the active layer comprises quantum dots or nano-particles.

4. The organic photovoltaic device of claim 1, wherein the active layer comprises at least two stacked layers of active materials.

5. The organic photovoltaic device of claim 4, wherein the active layer further comprises isolation layers disposed between each layer of active material.

6. The organic photovoltaic device of claim 1, wherein each of the first, second, and third electrodes comprises a non-transparent material.

7. The organic photovoltaic device of claim 1, wherein each electrode comprises an ink of nano-particle metal.

8. The organic photovoltaic device of claim 7, wherein the metal comprises copper or silver.

9. The organic photovoltaic device of claim 1, wherein each electrode covers a portion of a lateral area of the active layer.

10. The organic photovoltaic device of claim 1, wherein one of the electrodes circumscribes the active layer and the active layer circumscribes the other of the electrodes.

11. The organic photovoltaic device of claim 1, further comprising a focusing layer disposed over the first surface of the first active layer and the first electrode, the focusing layer directing incident light toward the first active layer.

12. The organic photovoltaic device of claim 11, wherein the focusing layer has a variable refractive index.

13. The organic photovoltaic device of claim 11, wherein the focusing layer comprises organo titanates.

14. The organic photovoltaic device of claim 11, wherein the focusing layer comprises an organic polymer and titanium dioxide, concentrations of titanium dioxide varying within the focusing layer to produce varying refractive indices.

15. The organic photovoltaic device of claim 11, wherein the focusing layer includes a regular lens or a Fresnel lens.

16. The organic photovoltaic device of claim 1, wherein the surfaces of contact between the active layers and the electrodes are parallel.

17. The organic photovoltaic device of claim 1, wherein a distance, across the first active layer, between the surfaces of the first active layer that contact the first and second electrode, respectively, is greater than about 200 nm and less than about 1000 nm.

18. The organic photovoltaic device of claim 1, wherein each active layer and each electrode is planar.

19. The organic photovoltaic device of claim 1, further comprising a focusing layer disposed over the first active layer, the second electrode, and the second active layer over their respective surfaces that receive light.

20. The organic photovoltaic device of claim 19, wherein the focusing layer directs incident light toward the first and second active layers.

21. The organic photovoltaic device of claim 19, wherein the focusing layer distributes light spectrum from the incident light between the first and second active layers.

* * * * *